(12) United States Patent
Uchida et al.

(10) Patent No.: US 11,772,301 B2
(45) Date of Patent: Oct. 3, 2023

(54) METHOD FOR MANUFACTURING HEXAGONAL SEMICONDUCTOR PLATE CRYSTAL

(71) Applicant: Mitsubishi Chemical Corporation, Tokyo (JP)

(72) Inventors: Hirofumi Uchida, Ushiku (JP); Yukio Okano, Ushiku (JP)

(73) Assignee: Mitsubishi Chemical Corporation, Tokyo (JP)

( * ) Notice: Subject to any disclaimer, the term of this patent is extended or adjusted under 35 U.S.C. 154(b) by 312 days.

(21) Appl. No.: 17/159,222

(22) Filed: Jan. 27, 2021

(65) Prior Publication Data

US 2021/0146575 A1 May 20, 2021

Related U.S. Application Data

(63) Continuation of application No. 15/826,361, filed on Nov. 29, 2017, now abandoned, which is a (Continued)

(30) Foreign Application Priority Data

Dec. 28, 2010 (JP) .................................. 2010-291559

(51) Int. Cl.
*B28D 5/04* (2006.01)
*C30B 29/64* (2006.01)
(Continued)

(52) U.S. Cl.
CPC .......... *B28D 5/045* (2013.01); *B24B 27/0633* (2013.01); *C30B 29/403* (2013.01); (Continued)

(58) Field of Classification Search
CPC .......... B24D 1/005; B24D 5/00; B24D 5/045; B24B 27/0633
See application file for complete search history.

(56) References Cited

U.S. PATENT DOCUMENTS

| 8,624,356 B2 | 1/2014 | Oshima |
| 2002/0028564 A1 | 3/2002 | Motoki et al. |

(Continued)

FOREIGN PATENT DOCUMENTS

| DE | 199 54 349 A1 | 6/2001 |
| JP | 10-044142 | 2/1998 |

(Continued)

OTHER PUBLICATIONS

International Search Report dated Feb. 21, 2012 in PCT/JP2011/079684 filed Dec. 21, 2011.

(Continued)

*Primary Examiner* — Joel D Crandall
(74) *Attorney, Agent, or Firm* — Oblon, McClelland, Maier & Neustadt, L.L.P.

(57) ABSTRACT

A method of manufacturing a hexagonal Group-III nitride semiconductor plate crystal using a crystal cutting wire. where the hexagonal semiconductor crystal has one principal face on one side and another principal face on an opposite side, and the hexagonal semiconductor crystal is cut by causing the crystal cutting wire to move so as to (i) divide the one principal face and the another principal face and (ii) satisfy conditions of Expressions (A) and (B):

25°<α≤90°    Expression (A); and

β=90°±5°    Expression (B)

where α represents an angle formed by a c axis of the hexagonal Group-III nitride semiconductor crystal and (Continued)

a normal line of a crystal face cut out by the wire, and β represents an angle formed by a reference axis, which is obtained by perpendicularly projecting the c axis of the hexagonal Group-III nitride semiconductor crystal to the crystal face cut out by the wire, and a cutting direction.

9 Claims, 7 Drawing Sheets

Related U.S. Application Data continuation of application No. 13/930,323, filed on Jun. 28, 2013, now abandoned, which is a continuation of application No. PCT/JP2011/079684, filed on Dec. 21, 2011.

(51) Int. Cl.
    *B24B 27/06*     (2006.01)
    *C30B 29/40*     (2006.01)
    *C30B 33/06*     (2006.01)

(52) U.S. Cl.
    CPC ............ *C30B 29/406* (2013.01); *C30B 29/64* (2013.01); *C30B 33/06* (2013.01)

(56) References Cited

U.S. PATENT DOCUMENTS

| | | |
|---|---|---|
| 2004/0168682 A1 | 9/2004 | Hammer et al. |
| 2005/0093101 A1 | 5/2005 | Matsumoto |
| 2005/0208687 A1 | 9/2005 | Kasai et al. |
| 2006/0249135 A1 | 11/2006 | Matsumoto |
| 2007/0023027 A1 | 2/2007 | Nakai et al. |
| 2007/0105485 A1 | 5/2007 | Matsumoto |
| 2008/0219910 A1 | 9/2008 | Kasai et al. |
| 2008/0277667 A1 | 11/2008 | Matsumoto |
| 2009/0236694 A1 | 9/2009 | Mizuhara et al. |
| 2009/0298265 A1 | 12/2009 | Fujiwara |
| 2010/0006082 A1 | 1/2010 | Glinski |
| 2010/0133657 A1 | 6/2010 | Oshima |
| 2010/0189981 A1 | 7/2010 | Poblenz et al. |
| 2011/0215440 A1 | 9/2011 | Fujiwara |
| 2011/0308371 A1 | 12/2011 | Mortia |

FOREIGN PATENT DOCUMENTS

| | | | |
|---|---|---|---|
| JP | 2002-29697 | | 1/2002 |
| JP | 2004-533347 | | 11/2004 |
| JP | 2005-298319 | | 10/2005 |
| JP | 2006-190909 | | 7/2006 |
| JP | 2007-237627 | | 9/2007 |
| JP | 2008-229752 | | 10/2008 |
| JP | 2008-305977 | A | 12/2008 |
| JP | 2009-152622 | | 7/2009 |
| JP | 2009-202406 | | 9/2009 |
| JP | 2009-286652 | | 12/2009 |
| JP | 2010-135382 | A | 6/2010 |
| JP | 2011-077325 | | 4/2011 |
| JP | 2011-77325 | A | 4/2011 |
| JP | 2011077325 | A * | 4/2011 |
| WO | 2007/029655 | | 3/2007 |
| WO | WO-2011040106 A1 * | 4/2011 | ........... C30B 29/406 |

OTHER PUBLICATIONS

Office Action dated Jun. 24, 2014 in the corresponding Japanese Patent Application No. 2010-291559 (with English Translation).
Office Action dated Sep. 9, 2014 in Japanese Patent Application No. 2010-291559 with English language translation.
Extended European Search Report dated Oct. 14, 2014 in Patent Application No. 11852771.2.
Office Action and Search Report dated Aug. 19, 2015 in Taiwanese Patent Application No. 100149102 (with English language translation).
Office Action dated Jan. 5, 2016 in Japanese Patent Application No. 2015-009487 (with English language translation).
Office Action dated Dec. 6, 2017 in Korean Patent Application No. 10-2013-7016471 with unedited computer generated English translation.
Office Action dated Jun. 27, 2018 in Korean Patent Application No. 10-2013-7016471 (with English language translation).
Office Acton dated Dec. 11, 2018 in Korean Patent Application No. 10-2013-7016471 with unedited computer generated English translation.

* cited by examiner

METHOD FOR MANUFACTURING HEXAGONAL SEMICONDUCTOR PLATE CRYSTAL

CROSS REFERENCE TO RELATED APPLICATIONS

This application is a continuation of U.S. application Ser. No. 15/926,361, filed on Nov. 29, 2017, which is a continuation of U.S. application Ser. No. 13/530,323 filed on Jun. 28, 2013, which is a continuation of PCT/JP2011/079684 filed on Dec. 21, 2011, the content of which is incorporated by reference, and claims foreign priority to JP 2010-251559 filed on Dec. 28, 2010, the entire contents of which are incorporated herein by reference.

TECHNICAL FIELD

The present invention relates to a method for manufacturing a hexagonal semiconductor plate crystal.

BACKGROUND ART

The following methods are known as a method of cutting a crystal such as a semiconductor crystal to cut out a plate crystal from the crystal. That is, a cutting method using a crystal cutting wire, a cutting method using a dicing saw, and a cutting method using an inner diameter saw are known. Recently, the method of cutting a plate crystal using a crystal cutting wire is widely used.

The cutting method using a crystal cutting wire has a merit that an entire crystal can be cut at a time regardless of the size of the crystal. Since a crystal is cut using a thin wire, the cutting method using a crystal cutting wire also has a merit that the cutting accuracy is high and the cutting loss is small, compared with the cutting method using an inner-diameter saw. Accordingly, the manufacturing yield is improved, which is advantageous.

As the cutting method using a crystal cutting wire, a technique of spirally winding a wire on the outside of plural guide roller groups arranged at a predetermined interval with a constant gap and causing a pedestal having a crystal to be cut attached thereto to move relative to a multi-strand wire suspended between two arbitrary guide rollers is known (see PTL 1). The cutting method using a crystal cutting wire also has a merit that a crystal can be cut into plural plate crystals at a time using a multi-strand wire. Accordingly, a crystal cutting method using a crystal cutting wire has been variously studied and various methods of manufacturing a plate crystal with high quality have been proposed (see PTLs 2 to 4).

CITATION LIST

Patent Literature

[PTL 1] JP-A-10-44142
[PTL 2] JP-A-2005-298319
[PTL 3] JP-A-2002-29897
[PTL 4] JP-A-2006-190909

SUMMARY OF INVENTION

Technical Problem

However, when a crystal is cut using a crystal cutting wire on the basis of the methods described in PTLs 2 to 4, cracks may occur in the obtained plate crystal or warpage thereof may increase. When a cutting speed is raised to enhance the manufacturing yield, the cracks increase and the warpage also increases.

Therefore, in order to solve the above-mentioned problems, the inventors have studied for an object of providing a method of efficiently manufacturing a hexagonal semiconductor plate crystal with small warpage using a crystal cutting wire.

Solution to Problem

The inventors have aggressively studied and found that the above-mentioned object could be achieved by cutting a hexagonal semiconductor plate crystal while causing a crystal cutting wire to move in a specific direction relative to the hexagonal semiconductor plate crystal. That is, the following invention is provided as means for solving the problem.

(1) A method of manufacturing a hexagonal semiconductor plate crystal by cutting a hexagonal semiconductor crystal using a crystal cutting wire,
wherein the hexagonal semiconductor crystal is cut by causing the crystal cutting wire to move relative to the hexagonal semiconductor crystal so as to satisfy conditions of Expressions (A) and (B):

$$25° < \alpha \leq 90° \quad \text{Expression (A); and}$$

$$\beta = 90° \pm 5° \quad \text{Expression (B)}$$

[where $\alpha$ represents an angle formed by a c axis of the hexagonal semiconductor crystal and a normal line of a crystal face cut out by the wire, and $\beta$ represents an angle formed by a reference axis, which is obtained by perpendicularly projecting the c axis of the hexagonal semiconductor crystal to the crystal face cut out by the wire, and a cutting direction].

(2) The method of manufacturing a hexagonal semiconductor plate crystal according to (1), wherein a moving speed of the crystal cutting wire in the cutting direction is equal to or more than 1 mm/h.

(3) The method of manufacturing a hexagonal semiconductor plate crystal according to (1) or (2), wherein the hexagonal semiconductor plate crystal is cut by causing the crystal cutting wire to move so as to satisfy a condition of Expression (C):

$$0° \leq \gamma < 75° \quad \text{Expression (C)}$$

[where $\gamma$ represents an angle formed by an extending direction of the crystal cutting wire and the reference axis].

(4) The method of manufacturing a hexagonal semiconductor plate crystal according to any one of (1) to (3), wherein a magnitude of warpage of the plate crystal is equal to or less than 1.0 μm/mm.

(5) The method of manufacturing a hexagonal semiconductor plate crystal according to any one of (1) to (4), wherein a maximum diameter of the plate crystal is equal to or more than 10 mm.

(6) The method of manufacturing a hexagonal semiconductor plate crystal according to any one of (1) to (5), wherein the plate crystal is manufactured by cutting two or more faces at a time using a plurality of crystal cutting wires installed in parallel with a specific gap therebetween.

(7) The method of manufacturing a hexagonal semiconductor plate crystal according to any one of (1) to (6), wherein a face formed by the cutting is ground after the cutting.

(8) The method of manufacturing a hexagonal semiconductor plate crystal according to any one of (1) to (7), wherein the hexagonal semiconductor crystal is a Group-III nitride semiconductor crystal.

(9) The method of manufacturing a hexagonal semiconductor plate crystal according to any one of (1) to (7), wherein the hexagonal semiconductor crystal is a gallium nitride crystal.

Advantageous Effects of Invention

By employing the method of manufacturing a hexagonal semiconductor plate crystal according to the present invention, it is possible to efficiently obtain a hexagonal semiconductor plate crystal with small warpage. Particularly, even when a cutting operation is performed at a speed higher than that in the background art, it is possible to suppress an invasion of cracks into the resultant plate crystal or an increase in warpage thereof.

DESCRIPTION OF EMBODIMENTS

Hereinafter, a method of manufacturing a hexagonal semiconductor plate crystal will be described in detail. Constituents may be described with reference to a representative embodiment or a specific example of the present invention, but the present invention is not limited to the embodiment or the specific example. A numerical value range expressed using "to" in this specification means a range including numerical values described before and after "to" as a lower limit value and an upper limit value.

A manufacturing method according to the present invention is characterized in that a hexagonal semiconductor crystal is cut while causing the crystal cutting wire to move so as to satisfy Expressions (A) and (B). Herein, "move" is based on the premise that the position of the crystal cutting wire is defined relative to the hexagonal semiconductor crystal, and the present invention also employs an aspect in which the hexagonal semiconductor crystal moves toward the crystal cutting wire.

$$25° < \alpha \leq 90° \quad \text{Expression (A)}$$

$$\beta = 90 \pm 5° \quad \text{Expression (B)}$$

<Expression (A)>

Figure 1:
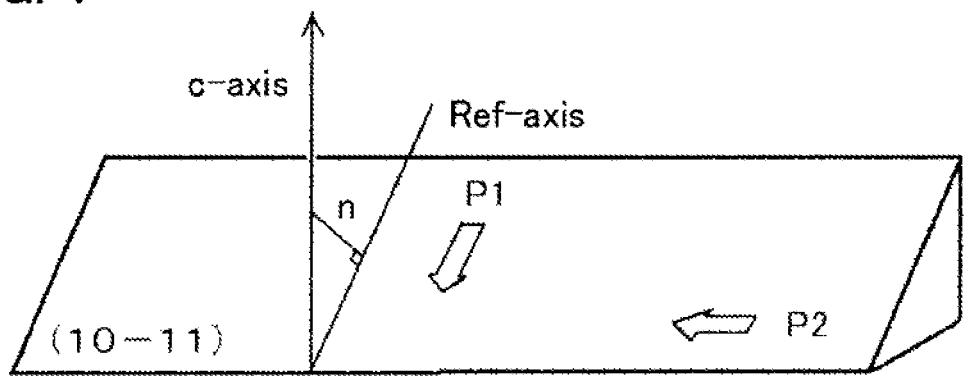
FIG. 1 is a diagram illustrating a relationship between a c axis and a reference axis.

In Expression (A), $\alpha$ represents an angle formed by the c axis of the hexagonal semiconductor crystal and the normal line of the crystal face cut out by the wire. In FIG. 1, the c axis of the hexagonal semiconductor crystal is marked by c-axis and the normal line is marked by n. In the present invention, any crystal face may be cut as long as it is a crystal face satisfying Expression (A). By appropriately adjusting $\alpha$, the principal face of the obtained plate crystal can be set to a specific face orientation. For example, when $\alpha$ is 61.9°, a plate crystal of which the principal face is {10-11} can be obtained. When $\alpha$ is 75.1°, a plate crystal of which the principal face is {20-21} can be obtained. When $\alpha$ is 43.2°, a plate crystal of which the principal face is {10-12} can be obtained. The face orientation of the principal face of the obtained plate crystal can be arbitrarily determined depending on applications or the like. Here, the "principal face" means the broadest face of the plate crystal and generally corresponds to the crystal face cut out by the wire.

The angle $\alpha$ formed by the c axis of the hexagonal semiconductor crystal to be cut and the normal line of the crystal face cut out by the wire satisfies the following expressions, from the viewpoint of marked effects of the present invention:

$$\text{preferably } 25° < \alpha < 90° \quad \text{Expression (A-1);}$$

$$\text{more preferably } 25° < \alpha < 85° \quad \text{Expression (A-2);}$$

$$\text{still more preferably } 25° < \alpha < 75° \quad \text{Expression (A-3);}$$

and $$\text{particularly preferably, } 25° < \alpha < 60° \quad \text{Expression (A-4).}$$

By setting the angle to the range of Expression (A-1), it is possible to more effectively suppress warpage of the plate crystal. By sequentially setting the angle to the ranges of Expression (A-2), (A-3), and (A-4), the effects of the present invention can be more markedly exhibited in the order.

<Expression (B)>

Figure 3:
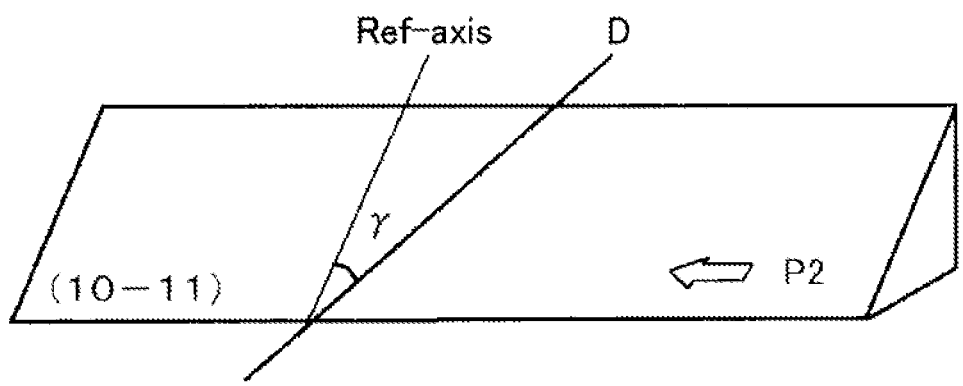
FIG. 3 is a diagram illustrating a relationship between the reference axis and an extending direction of the wire.

In Expression (B), $\beta$ represents an angle formed by a reference axis, which is obtained by perpendicularly projecting the c axis of the hexagonal semiconductor crystal to the crystal face cut out by the wire, and a cutting direction. Here, the perpendicular projection means projection in a direction perpendicular to the crystal face cut out by the wire. FIG. 1 shows the relationship between the c axis and the reference axis when the crystal face cut out by the wire is a (10-11) face. In FIGS. 1 and 3, the reference axis is marked by Ref-axis. When the cutting direction is a direction (that is, a direction parallel to the reference axis) indicated by P1 in FIG. 1, $\beta$ is 0°. When the cutting direction is a direction (that is, a direction perpendicular to the reference axis) indicated by P2 in FIG. 1, $\beta$ is 90°.

By satisfying Expression (B), the hexagonal semiconductor crystal can be linearly cut at the time of cutting the hexagonal semiconductor crystal, and it is thus possible to suppress warpage of the obtained plate crystal. This mechanism is not clear, but it is thought that it is associated with cleavage or polarity of the obtained hexagonal semiconductor crystal.

For example, when a GaN crystal is used, it is thought that the cleavage of the {1-100} face is higher than that of the {11-20} and it is thought that when it gets close to the face having high cleavage in the course of cutting, the movement of the wire departs from the straight moving direction and thus the obtained GaN plate crystal warps.

For example, when a GaN plate crystal is used, the polarity varies depending on whether the atom exposed from the outermost surface of the principal face is Ga or N. That is, it is thought that the polarities of two opposite surfaces of the GaN plate crystal are different depending on the ratio of Ga and N existing on the surface of the GaN plate crystal obtained by the cutting. When the polarity of a crystal face varies, it is known that the hardness varies due to the difference in chemical stability. Since the wire gets off to a side having low hardness depending on the machining load of the cutting due to the difference in hardness between the opposite surfaces, it is thought that the obtained GaN plate crystal warps.

It is predicted that this problem can be avoided by performing the cutting from a specific direction as in the present invention. The GaN crystal is described above as a specific example, but the same effects of the present invention are achieved in hexagonal semiconductor crystals, because they have the same crystal structure.

Figure 2:
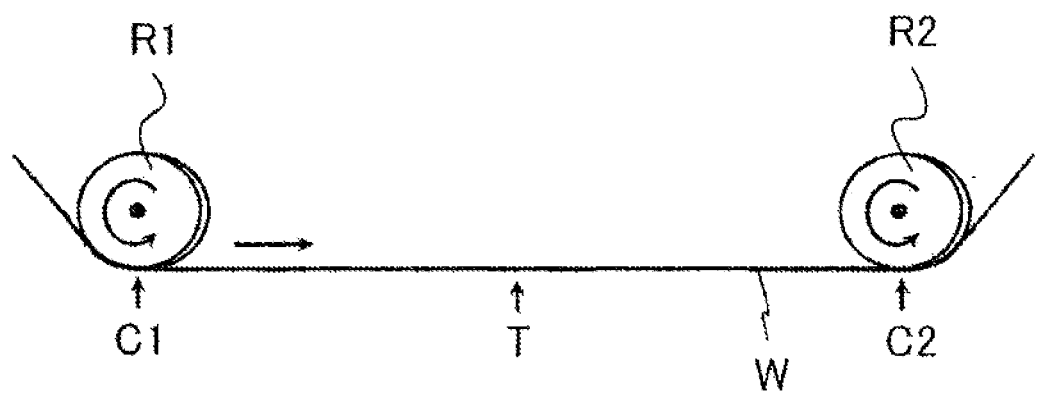
FIG. 2 is a diagram illustrating a crystal cutting wire moving between rollers.

In the present invention, the "cutting direction" means a direction in which the center point of the linear portion of the crystal cutting wire moves relative to the crystal. Here, the linear portion means the linear portion of the wire linearly extending to cut a crystal. In general, as shown in FIG. 2, the linear portion of a wire is formed by causing the crystal cutting wire W to move between two rollers R1 and R2. The center point of the linear wire portion corresponds to the midpoint T of the first contact points C1 and C2 of the linear portion with the rollers R1 and R2. During cutting a crystal, there may be three aspects of an aspect in which the midpoint T moves relative to the fixed crystal, an aspect in which the crystal moves relative to the fixed midpoint T, and an aspect in which the crystal and the midpoint T move together to perform the cutting. The present invention may employ any aspect. In any aspect, the cutting direction can be determined by checking the trace of the midpoint T moving over the cut crystal face. In FIG. 2, a case where the midpoint T minutely swings relative to the crystal can be considered such as a case where the cutting is performed while the crystal swings laterally or a case where the cutting is performed while the rollers R1 and R2 swing laterally. In this case, the center point of the trace of the midpoint T minutely swinging per unit time can be considered as the "midpoint" in the time and the cutting direction can be determined by checking the trace of the relative "midpoint", which is viewed from the crystal, moving with the lapse of time.

In the manufacturing method according to the present invention, the moving speed (which is the moving speed of the crystal cutting wire in the cutting direction and corresponds to the cutting speed) of the midpoint T in the cutting direction is generally set to be equal to or more than 0.7 mm/h, preferably to be equal to or more than 1 mm/h, more preferably to be equal to or more than 3 mm/h, and still more preferably to be equal to or more than 5 mm/h. The moving speed (the moving speed of the crystal cutting wire) of the midpoint T is generally set to be equal to or less than 50 mm/h, preferably to be equal to or less than 40 mm/h, more preferably to be equal to or less than 35 mm/h, and still more preferably to be equal to or less than 30 mm/h. When the moving speed is equal to or more than 0.7 mm/h, the cutting time is shortened and productivity is improved, which is desirable. When the moving speed is 50 mm/h, a scratch is not formed well on the crystal face obtained by the cutting and the possibility of cracks can be reduced, which is desirable. In the manufacturing method according to the present invention, even when the crystal cutting wire is made to move at a high speed of 30 mm/h or more, it is possible to suppress cracks and to reduce warpage.

In the manufacturing method according to the present invention, it is preferable that the cutting be performed while always maintaining $\beta$ at a constant angle in the course of cutting a crystal.

The angle $\beta$ formed by the c axis of the hexagonal semiconductor crystal and the cutting direction satisfies the following expressions:

preferably $\beta = 90° \pm 4°$   Expression (B-1);

more preferably $\beta = 90° \pm 3°$   Expression (B-2);

still more preferably $\beta = 90° \pm 2°$   Expression (B-3);

and particularly preferably $\beta = 90° \pm 1°$   Expression (B-4).

By sequentially setting the angle to the ranges expressed by Expression (B-1), Expression (B-2), Expression (B-3), and Expression (B-4), the warpage of the obtained plate crystal can be further reduced.

<Expression (C)>

In the manufacturing method according to the present invention, it is preferable that the hexagonal semiconductor crystal be cut by causing the crystal cutting wire to move so as to satisfy the condition of Expression (C):

$0° \leq \gamma \leq 75°$   Expression (C).

In Expression (C), $\gamma$ represents an angle formed by the extending direction of the crystal cutting wire and the reference axis of the cut crystal face. The extending direction of the crystal cutting wire means a direction of the linear wire portion used to cut the crystal. In FIG. 3, the extending direction of the crystal cutting wire is marked by D. In general, since a crystal is cut while causing the wire to linearly move, the moving direction of the wire corresponds to the extending direction of the wire mentioned in the present invention. For example, the direction from C1 to C2 in FIG. 2 is the extending direction of the crystal cutting wire. Since the linear wire portion moves over the cut crystal face, $\gamma$ is the angle shown in FIG. 3, assumed that the (10-11) face of FIG. 1 is cut.

The angle $\gamma$ formed by the extending direction of the crystal cutting wire and the reference axis of the cut crystal face satisfies the following expressions:

preferably $0° \leq \gamma \leq 75°$   Expression (C-1);

more preferably $0° \leq \gamma \leq 45°$   Expression (C-2);

still more preferably $0° \leq \gamma \leq 5°$   Expression (C-3);

and particularly preferably $0° \leq \gamma \leq 5°$   Expression (C-4).

By sequentially setting the angle to the ranges expressed by Expression (C-1), Expression (C-2), Expression (C-3), and Expression (C-4), the warpage of the obtained plate crystal is further reduced.

<Crystal Cutting Wire>

The type of the crystal cutting wire used in the manufacturing method according to the present invention is not particularly limited, as long as it can cut a hexagonal semiconductor crystal. In general, an apparatus is used which includes a mechanism cutting by pressing a moving wire against a hexagonal semiconductor crystal. The moving direction may be a single direction or both directions of forward and backward directions. When the wire moves in both directions, the time in which the wire moves at a constant speed in one direction and the time in which the wire moves at a constant speed in the other direction are preferably guaranteed. The moving speed when the wire moves in one direction or the moving speed when the wire moves at a constant speed in the forward and backward directions is set preferably to be equal to or more than 100 m/min, more preferably to be equal to or more than 300 m/min, and still more preferably to be equal to or more than 400 m/min. The moving speed when the wire moves in one direction or the moving speed when the wire moves at a constant speed in the forward and backward directions is set preferably to be equal to or less than 1500 m/min and more preferably to be equal to or less than 1000 m/min.

For example, the following method can be employed as a crystal cutting method using the crystal cutting wire. That is, a method (loose abrasive-grain method) of performing a kind of abrasive cutting by supplying a slurry in which abrasive grains are mixed with water or oil to a contact portion of the crystal cutting wire and the hexagonal semiconductor crystal, a method (fixed abrasive-grain method) of cutting a hexagonal semiconductor crystal by pressing the crystal cutting wire in which abrasive grains including diamond or the like are fixed to the surface thereof against the hexagonal semiconductor crystal while causing the wire to move at a high speed can be used. In the present invention, the crystal cutting wire using the fixed abrasive-grain method is preferably used, in that the cutting speed is high and thus the cleaning time thereof is short.

The fixation of the abrasive grains to the surface of the crystal cutting wire using the fixed abrasive-grain method can be carried out, for example, by electrodeposition. By using the shape changed by removing abnormal protruding abrasive grains or abrasive-grain sharp portions through abrasive cutting after electrodepositing and fixing the abrasive grains, cracks due to the cutting do not invade the hexagonal semiconductor crystal well, which is desirable. Accordingly, an aspect in which a truing grindstone is disposed in the moving path of the crystal cutting wire and the hexagonal semiconductor crystal is cut after the truing grindstone moves can be employed. When the wire moves only in one direction, the truing grindstone has only to be disposed short of the hexagonal semiconductor crystal. When the wire alternately moves in both directions, the truing grindstones are preferably disposed on both sides of the hexagonal semiconductor crystal. Examples of the abrasive grains of the grindstone include alundum (A), white alundum (WA), pink alundum (PA), dismantled-alumina (HA), artificial emery (AE), alumina zirconia (AZ), carborundum (C), green carborundum (GC), cubic boron nitride (CBN), and diamond. The particle size of the abrasive grains is preferably equal to or more than 5 μm. The particle size of the abrasive grains is preferably equal to or less than 60 μm, more preferably equal to or less than 40 μm, still more preferably equal to or less than 30 μm, and still more preferably equal to or less than 20 μm.

A fixed abrasive-grain wire can be formed by combining a wire having a specific strand diameter with abrasive grains of which the central value of the particle diameter is in a specific range.

The strand diameter of the fixed abrasive-grain wire used in the present invention is preferably equal to or more than 70 μm, more preferably equal to or more than 120 μm, still more preferably equal to or more than 140 μm, still more preferably equal to or more than 160 μm, still more preferably equal to or more than 170 μm, and most preferably equal to or more than 180 μm. The strand diameter is preferably equal to or less than 200 μm and more preferably equal to or less than 190 μm. When a wire with a relatively larger strand diameter is used, the breaking strength of the wire itself is high and thus a sufficient tension can be applied at the time of cutting, which is desirable.

The average particle size of the abrasive grains used in the present invention is preferably equal to or more than 5 μm and more preferably equal to or more than 10 μm. The average particle size thereof is preferably equal to or less than 60 μm, more preferably equal to or less than 40 μm, still more preferably equal to or less than 30 μm, still more preferably equal to or less than 25 μm, and particularly preferably equal to or less than 20 μm. When abrasive grains with a relatively small average particle size are used, the number of abrasive grains having an abnormally protruding surface shape tends to be reduced, an impact on a workpiece can be reduced, and the surface roughness of the workpiece can be suppressed, which is desirable.

As the abrasive grains having an average particle size within the above-mentioned preferable range, for example, the grain size indication of a fixed abrasive-grain wire generally available is preferably equal to or less than 3000 meshes and more preferably equal to or less than 1500 meshes. The grain size indication is preferably equal to or more than 230 meshes, mere preferably equal to or more than 325 meshes, still more preferably equal to or more than 400 meshes, still more preferably equal to or more than 600 meshes, and particularly preferably equal to or more than 800 meshes.

By sequentially setting the grain size indication to the above-mentioned preferable ranges, the warpage of the obtained plate crystal can be further reduced.

Figure 4A:
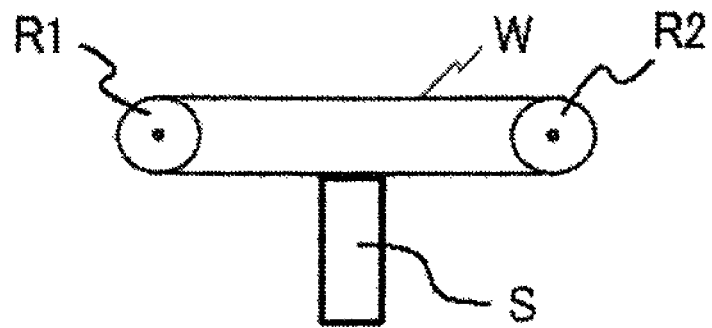
FIGS. 4A to 4D are diagrams illustrating directions of a linear portion of the crystal cutting wire.
Figure 4B:
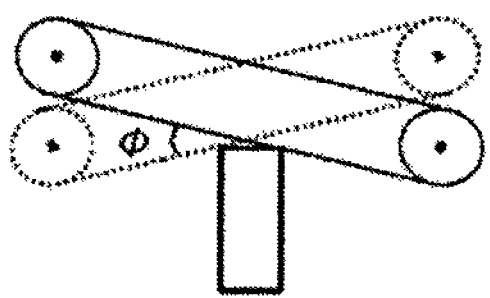
Figure 4C:
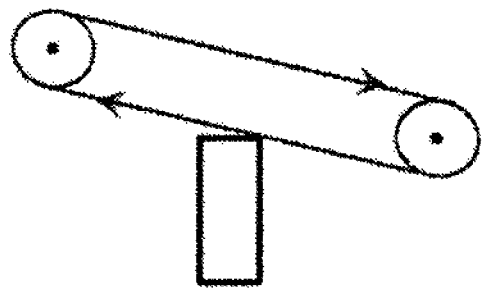
Figure 4D:
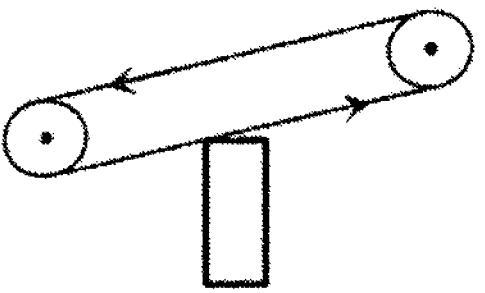

In the crystal cutting wire used in the manufacturing method according to the present invention, the linear wire portion may be directed to a constant direction relative to the hexagonal semiconductor crystal, as shown in FIG. 4A. As shown in FIG. 4B, the linear wire portion may swing relative to the hexagonal semiconductor crystal. The swinging may be carried out by causing the positions of the rollers R1 and R2 defining the linear wire portion to move up and down. That is, the swinging can be carried out by causing the positions of the rollers R1 and R2 to move up and down so as to alternately take the state shown in FIG. 4C and the state shown in FIG. 4D. When the state shown in FIG. 4C is changed to the state shown in FIG. 4D, the position of the roller R1 is lowered and the position of the roller R2 is raised. When the state shown in FIG. 4D is changed to the state shown in FIG. 4C, the position of the roller R1 is raised and the position of the roller R2 is lowered. By manipulating the rollers in this way, the midpoint of the linear wire portion does not swing.

The swinging method shown in FIGS. 4B to 4D can be appropriately arranged. For example, as described in JP-A-2008-229752, an aspect in which two rollers move about a swinging center axis by the same distance in the same circumferential direction can be preferably employed (particularly see examples and FIG. 1 of JP-A-2008-229752).

The maximum swinging angle φ when the crystal cutting wire swings is preferably equal to or less than 10°. The maximum swinging angle φ when the crystal cutting wire swings is preferably equal to or more than 1°, more preferably equal to or more than 5°, and still more preferably equal to or more than 7°. In the course of cutting a crystal, the maximum swinging angle φ may be kept constant or may be changed. Preferably, the maximum swinging angle is kept constant. The swinging cycle of the wire is preferably equal to or less than 1000 times/min. The swinging cycle of the wire is preferably equal to or more than 200 times/min, more preferably equal to or more than 400 times/min, and still more preferably equal to or more than 700 times/min.

<Aspects of Cutting>

In the manufacturing method according to the present invention, a plate crystal is manufactured by forming at least one cut face through the cutting satisfying the conditions of Expression (A) and Expression (B).

An example of the aspect of manufacturing a plate crystal by forming only one cut face through the cutting satisfying the conditions of Expression (A) and Expression (B) is an aspect in which an end of a crystal ingot is cut so as to satisfy the conditions of Expression (A) and Expression (B). A plate crystal may be manufactured by performing the cutting to be substantially parallel to the cut face so as to satisfy the conditions of Expression (A) and Expression (B) after cutting a crystal ingot in advance using a conventional method. After the cutting is first, performed so as to satisfy the conditions of Expression (A) and Expression (B), the cutting may be performed to be substantially parallel to the cut face using the conventional method.

An aspect of manufacturing a plate crystal by forming two or more cut faces through the cutting satisfying the conditions of Expression (A) and Expression (B) can be preferably employed. At this time, two or more cut faces may be formed at a time by simultaneously performing the cutting or two or more cut faces may be gradually formed by sequentially performing the cutting. The method of forming two or more cut faces at a time by simultaneously performing the cutting can be preferably employed. When the cutting is simultaneously performed, it is preferable that two or more cut faces be formed at a time using a wire series including plural crystal cutting wires which are arranged in parallel and operates as a unified body. The method using a wire series in which plural wires are arranged in a strip shape with a constant gap therebetween is particularly preferable. When such a wire series is used, it is possible to efficiently manufacture plate crystals with the same thickness.

When a plate crystal is manufactured by forming two or more cut faces, the first cut face and the second cut face may not be necessarily parallel to each other. The angle formed by two cut faces has only to be substantially parallel to each other. In the present invention, the "substantially parallel" means that the angle is equal to or less than 10°. The angle formed by two cut faces is preferably equal to or less than 5°, more preferably equal to or less than 2°, still more preferably equal to or less than 1°, and most preferably 0° (parallel).

It is determined from what portion of a crystal ingot a plate crystal is cut out, in consideration of the size, the principal face, and the thickness of a plate crystal to be obtained, the shape of the crystal ingot, the magnitude of the dislocation density, the magnitude of the impurity concentration, and the like. Easiness of fixation at the time of fixing the crystal ingot to a pedestal or the like can also be considered.

Figure 5A:
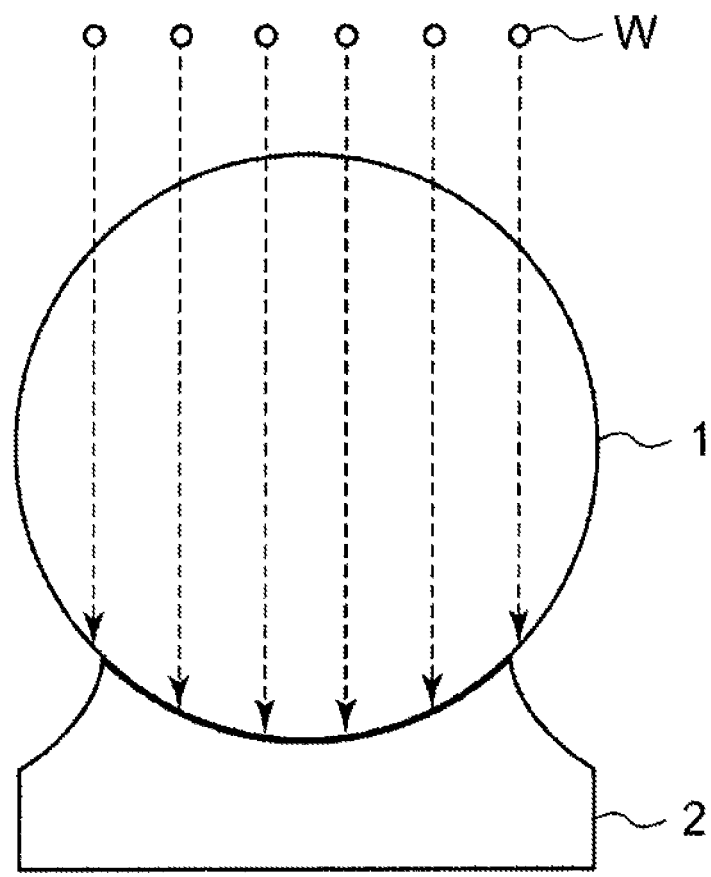
FIGS. 5A and 5B are diagrams illustrating a cutting direction of a hexagonal semiconductor crystal in Example 1 (where FIG. 5A is a side view and FIG. 5B is a top view).
Figure 5B:
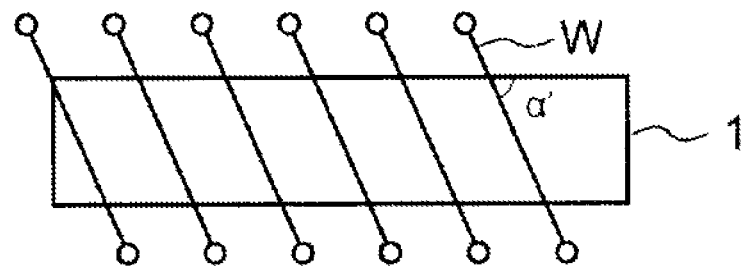

It is preferable that the hexagonal semiconductor crystal be fixed to the pedestal in a direction suitable for the cutting and the cutting be performed by causing the pedestal to move toward the crystal cutting wire. For example, when β=90° is set, as shown in FIGS. 5A and 5B, an aspect in which the cutting is performed by fixing a disk-like hexagonal semiconductor crystal 1 to a pedestal 2 with an adhesive so that a circular principal face of the disk-like hexagonal semiconductor crystal 1 with the (0001) face as the principal face faces the horizontal direction and causing the resultant structure to move toward a crystal cutting wire W from down to up (or causing the crystal cutting wire W to move toward the hexagonal semiconductor crystal 1 fixed to the pedestal 2 from up to down) can be employed. At this time, the cutting is performed so that the angle α' formed by the extending direction of the wire and the hexagonal semiconductor crystal is equal to the angle α.

Figure 6A:
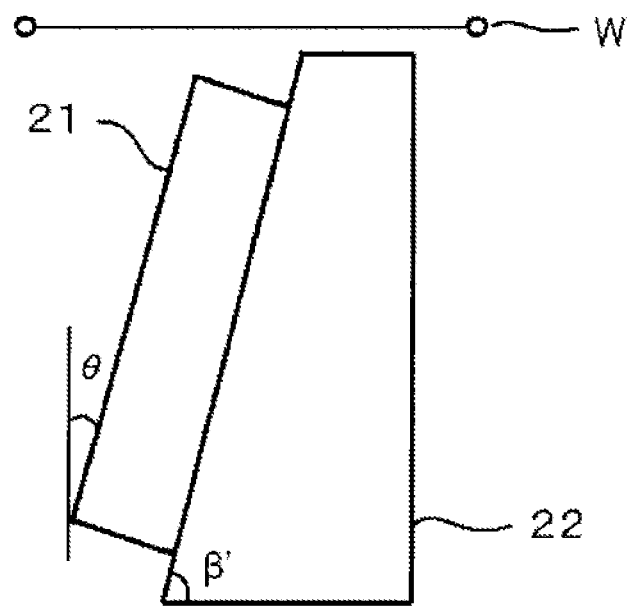
FIGS. 6A and 6B are diagrams illustrating a cutting direction of a hexagonal semiconductor crystal when $\beta$ is not 90° (where FIG. 6A is a side view and FIG. 6B is a top view).
Figure 6B:
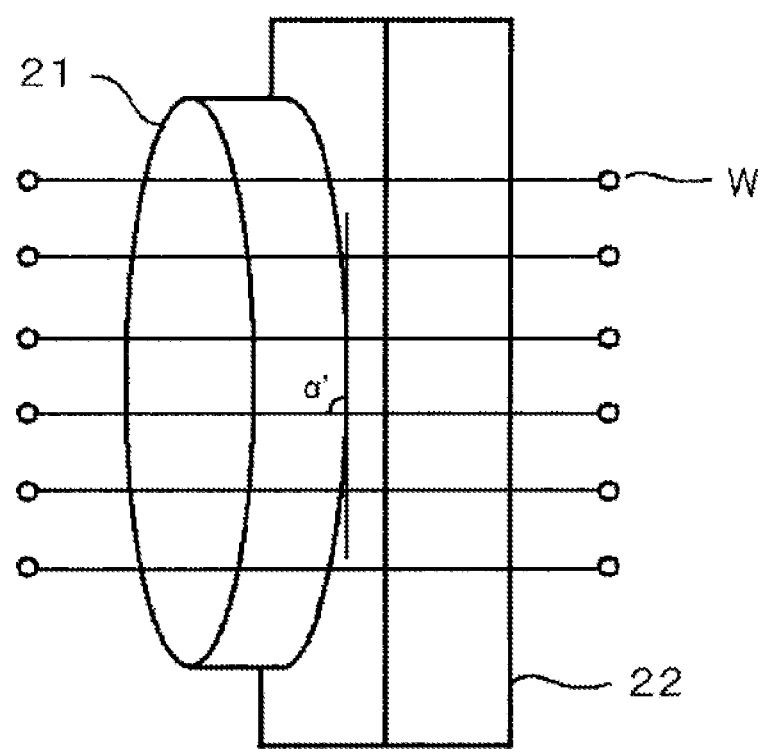
Figure 7A:
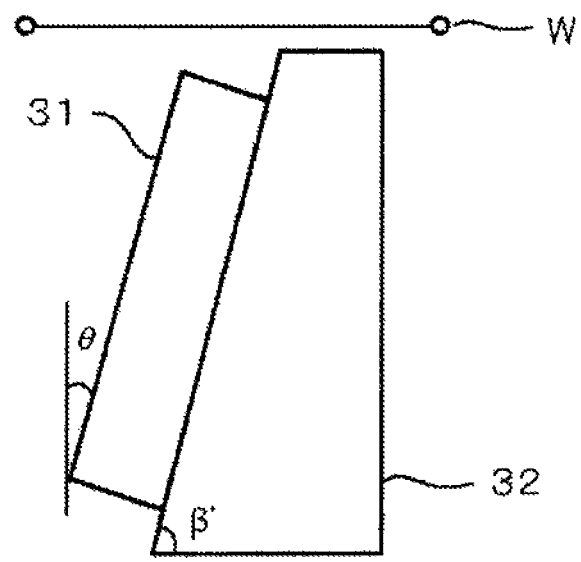
FIGS. 7A and 7B are diagrams illustrating another cutting direction of a hexagonal semiconductor crystal when $\beta$ is not 90° (where FIG. 7A is a side view and FIG. 7B is a top view).
Figure 7B:
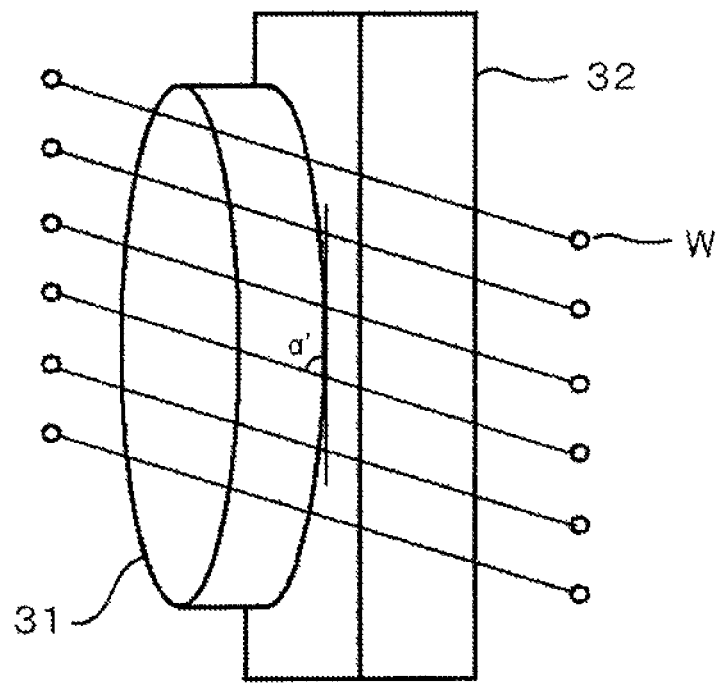

In another aspect, for example, when β is not equal to 90° such as β=85% as shown in FIGS. 6A and 6B and FIGS. 7A and 7B, the cutting can be performed by fixing hexagonal semiconductor crystals 21 and 31 to a slope of the pedestal with a slope angle of β' and causing the resultant structure toward the crystal cutting wire from down to up (or causing the crystal cutting wire W toward the hexagonal semiconductor crystals 21 and 31 fixed to the pedestals 22 and 32 from up to down). At this time, the slope angle β' of the slope of the pedestal is disposed to be equal to the angle β and the cutting is then performed. In other words, the slope angle θ from the vertical direction of the crystal is disposed to be 90-β and the cutting is then performed. As shown in FIGS. 6A and 6B, an M face can be cut out by disposing the extending direction of the wire to be perpendicular to the (0001) face which is the principal face of the crystal (to cross the crystal at an angle at which the angle α' shown in FIG. 6B is 90°). Here, the M face is a face equivalent to the {1-100} face and specific examples thereof include the (1-100) face, the (−1100) face, the (01-10) face, the (0-110) face, the (10-10) face, and the (−1010) face. As shown in FIGS. 7A and 7B, when the cutting is performed so that the extending direction of the wire crosses the crystal at the angle α', for example, the (20-21) face or the like can be cut out. At this time, the angle α' is set to be equal to the angle α. In this way, when the aspects shown in FIGS. 6A and 6B and FIGS. 7A and 7B are employed, the cutting is performed by appropriately selecting the angle formed by the crystal face of the hexagonal semiconductor crystal attached to the pedestal and the slope of the pedestal or the angle formed by the crystal and the extending direction of the wire so as to satisfy the conditions of the present invention. An adhesive such as an epoxy resin can be appropriately selected and used for the fixation to the pedestal. An X-ray diffraction method or the like can be used to measure the crystal orientation. The shape of the hexagonal semiconductor crystal to be cut is not particularly limited, and may be any of a disk shape, a rectangular parallelepiped shape, a parallelepiped shape, a pentagonal shape, shapes of which the principal face swells like a dome, and an ingot shape.

<Process After Cutting>

On the face formed after the cutting according to the present invention, processes which are generally performed on a face obtained through the cutting can be appropriately selected and performed. For example, polishing or etching using an aqueous acid or an aqueous base can be performed.

When the polishing is performed, for example, a lapping process or a polishing process using acidic colloidal silica can be performed.

<Hexagonal Semiconductor Crystal>

The type of the hexagonal semiconductor crystal manufactured using the manufacturing method according to the present invention is not particularly limited, and examples thereof include SiC, ZnO, GaN, InN, AlN, InGaN, AlGaN, and AlInGaN. Preferable examples thereof include Group-III nitride semiconductor crystals such as GaN, InN, AlN, InGaN, AlGaN, and AlInGaN. More preferable examples include GaN, AlN, AlGaN, and AlInGaN and a still more preferable example is GaN. In the description of the present invention, a GaN (gallium nitride) crystal is mentioned as an example of the hexagonal semiconductor crystal, but the hexagonal semiconductor crystal which can be employed in the present invention is not limited to GaN.

The crystal face cut out through the manufacturing method according to the present invention is not particularly limited, as long as it is a crystal face which can be cut out in principle using the manufacturing method according to the present invention. Typical examples of the crystal face include the (10-11) face, the (20-21) face, the (10-12) face, the (11-21) face, and the (11-22) face.

The "plate crystal" obtained using the manufacturing method according to the present invention means a crystal with a thickness smaller than the maximum diameter of the crystal. The detailed shape thereof is not particularly limited, as long as it is a plate shape. The maximum diameter of the plate crystal obtained using the manufacturing method according to the present invention is generally equal to or more than 10 mm. From the viewpoint that the effects of the present can be more markedly achieved, the maximum diameter of the plate crystal is preferably equal to or more than 20 mm and more preferably equal to or more than 25 mm. Here, the "maximum diameter" means the length of the longest diameter in the principal face of the plate crystal.

The magnitude of warpage of the plate crystal obtained using the manufacturing method according to the present invention is generally equal to or less than 3 μm/mm, preferably equal to or less than 1.0 μm/mm, more preferably equal to or less than 0.8 μm/mm, still more preferably equal to or less than 0.5 μm/mm, and particularly preferably equal to or less than 0.3 μm/mm. Here, the magnitude of warpage means the magnitude of warpage of the plate crystal after being cut using the manufacturing method according to the present invention and means a measured value before performing the post-process such as polishing. Specifically, the magnitude of warpage means the value obtained by converting the magnitude of warpage per specific length passing through the center of the principal face of the plate crystal in terms of 1 mm and is defined as a value obtained by dividing a waviness profile WCM defined in JIS B 0601 (1994) (associated standard JIS B 0610 (1987)) by an evaluated length, similarly to the method described in the Example. Here, the magnitude of warpage of the plate crystal is obtained by measuring the Z part shown in FIG. 9.

For example, the magnitude of warpage per evaluated length 5 mm of square plate crystals of 5 mm to 10 mm is generally less than 15 μm, preferably less than 10 μm, and more preferably less than 5 μm. The magnitude of warpage per evaluated length 50 mm of disk-like plate crystals with a diameter of 2 inches is generally less than 40 μm, preferably less than 30 μm, and more preferably less than 20 μm.

A hexagonal semiconductor plate crystal manufactured using the manufacturing method according to the present invention can be used for various applications. Particularly, the hexagonal semiconductor plate crystal can be usefully used as substrates of light-emitting devices with relatively short wavelengths such as light-emitting diodes of ultraviolet, blue, or green or semiconductor lasers or semiconductor devices such as electronic devices. It may be possible to obtain a larger hexagonal semiconductor crystal using the hexagonal semiconductor plate crystal manufactured through the manufacturing method according to the present invention as a seed.

EXAMPLES

Hereinafter, features of the present invention will be described in more detail with reference to examples and comparative examples. Materials, amounts of use, ratios, processing details, processing sequences, and the like described in the following examples can be appropriately changed without departing from the concept of the present invention. Therefore, the scope of the present invention should not be analyzed to be restricted by the following specific examples. In FIGS. 5A and 5B and FIGS. 8A and 8B, disk-like crystal samples 1 and 11 are shown as the hexagonal semiconductor crystal 1 for the purpose of easy understanding of technical details, but semi-disk crystal samples 1 and 11 are used in the following examples and comparative examples.

Example 1

A gallium nitride crystal having a disk-like (0001) face as a principal face with a diameter of 50 mm and a thickness of 7 mm was equally divided into two parts to prepare semi-disk crystal samples 1. The obtained semi-disk crystal sample 1 was fixed to a pedestal with an epoxy-based adhesive, in the same way as shown in FIGS. 5A and 5B. At this time, the crystal sample 1 was fixed in the direction in which the cutting could be performed to satisfy the conditions of α, β, and γ described in Table 1.

An apparatus in which 70 wires each having diamond abrasive grains with an average particle size described in Table 1 electrodeposited to the surface thereof were arranged in parallel was prepared as the crystal cutting wire. Among these wires, 35 wires contributed to the cutting of the gallium nitride crystal in Example 1. The wires arranged in parallel were controlled to move in both directions of the forward direction and the backward direction while swinging at the same timing. At this time, the midpoint of the linear wire portion was set not to swing. The maximum swinging angle φ was controlled to 10°, the maximum moving speed of the wire was controlled to 330 m/min, and the swinging cycle of the wire was controlled to 800 times/min.

The crystal sample 1 was cut using the crystal cutting wire controlled in this way so as to satisfy the conditions of α, β, and γ described in Table 1. Specifically, the crystal cutting wire W and the crystal sample 1 were arranged and the cutting was performed so that the angle α' formed by the extending direction of the wire and the crystal is equal to 61.9°. The cutting was performed by causing the crystal sample 1 fixed to the pedestal to move toward the moving crystal cutting wire W at a speed described in Table 1, whereby a plate crystal of which both faces were cut out by the crystal cutting wire was obtained.

Figure 9:
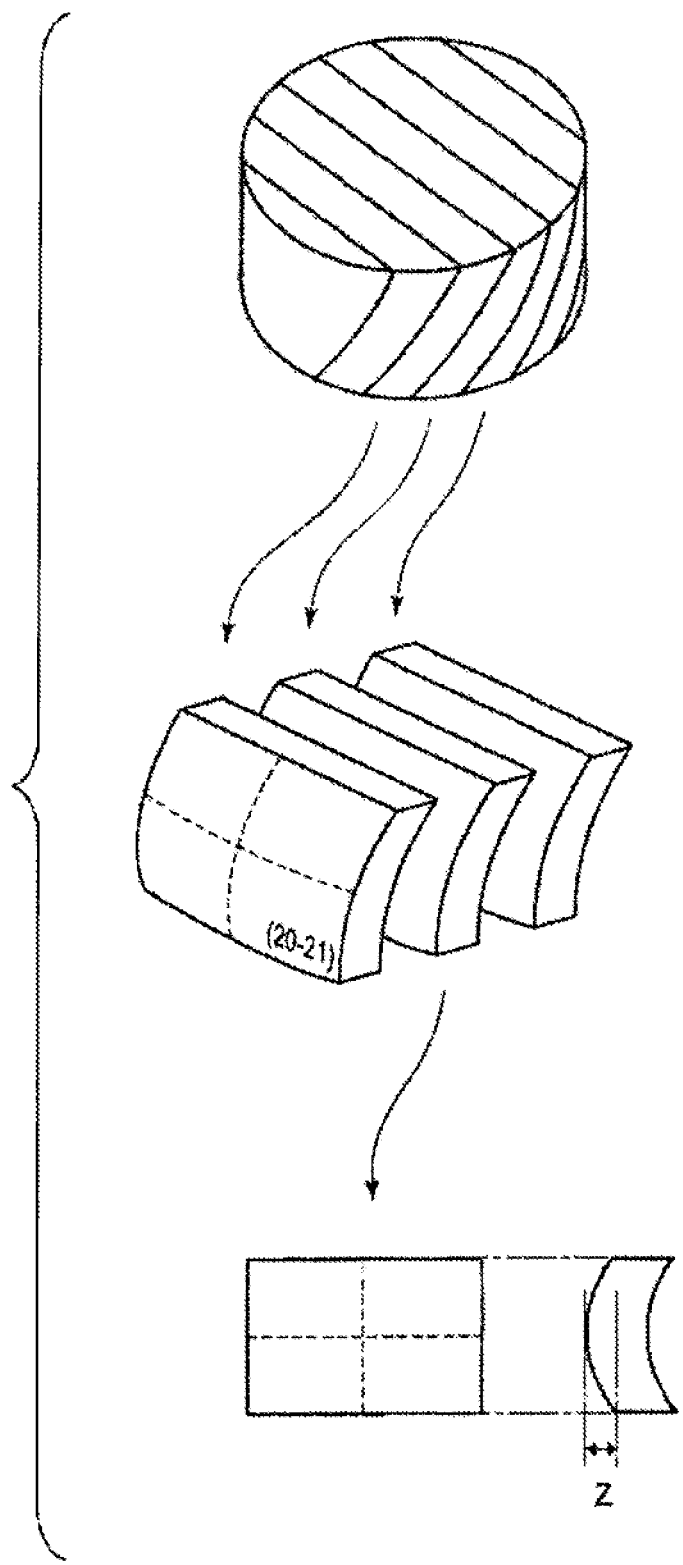
FIG. 9 is a diagram illustrating magnitudes of warpage of a hexagonal semiconductor plate crystal.

The obtained plate crystal was a crystal of which the principal face with a long side of 50 mm is substantially rectangular. Here, the long side had a length equal to the length of the principal face crossed by the wire in FIGS. 5A and 5B. The warpage of the plate crystal was evaluated by measuring the maximum waviness profile WCM on the basis of JIS B 0601 (1994) (associated standard JIS B 0610 (1987)). The measurement was performed using SURFCOM 130A made by TOKYO SEIMITSU CO., LTD. and using the measurement mode to waviness profile measurement (JIS' 94) (measurement speed: 0.6 mm/s, cutoff value: 0.8 mm, filter type: Gaussian, measurement range: ±400 μm, slope correction: linear). At this time, the magnitude of warpage was measured for the range with the total length of 5 mm extending by ±2.5 mm from the center of the principal face of the plate crystal to the short side (FIG. 9). Three crystals out of the obtained plate crystals were subjected to measurement and the average thereof was calculated. The result is shown in Table 1.

Example 11, Comparative Examples 1 to 4 and 11

Figure 8A:
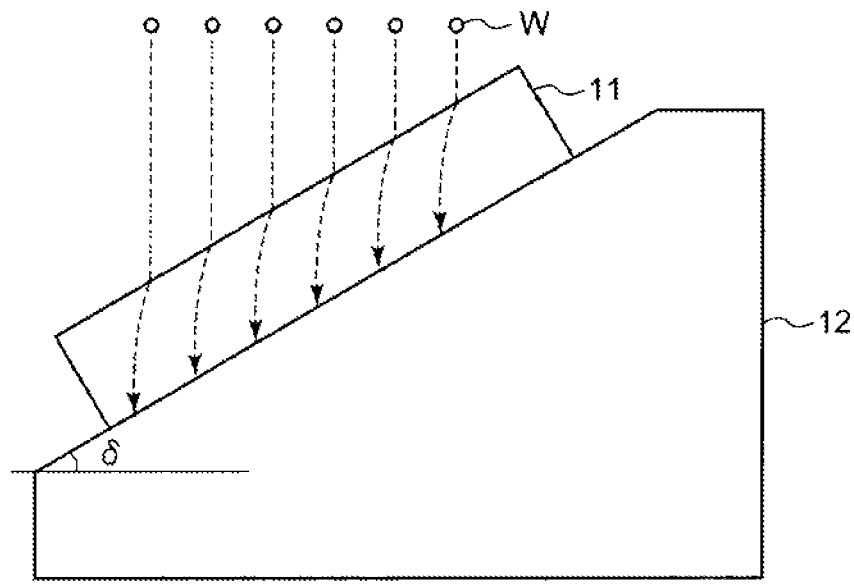
FIGS. 8A and 8B are diagrams illustrating a cutting direction of a hexagonal semiconductor crystal in Comparative Example 1 (where FIG. 8A is a side view and FIG. 8B is a top view).
Figure 8B:
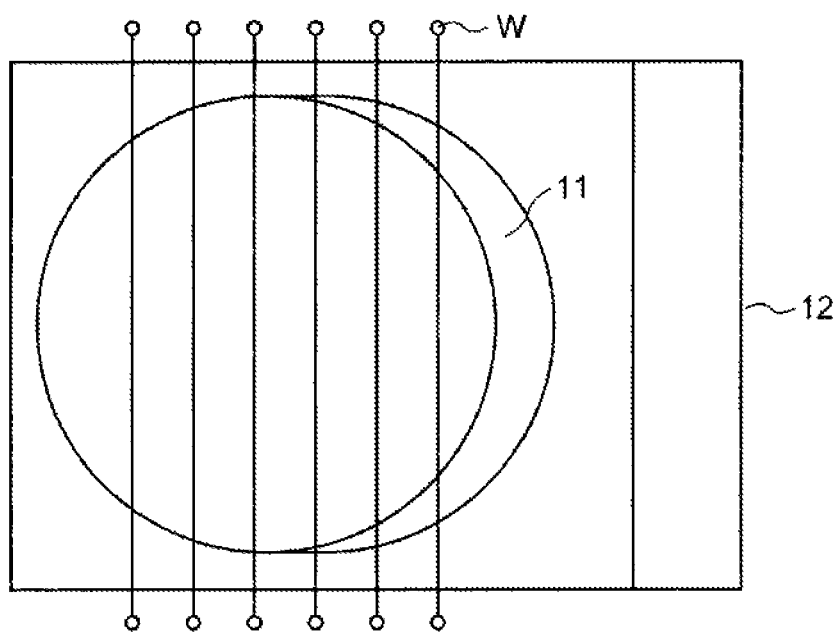

Plate crystals of which both faces were cut out by the crystal cutting wire were obtained in the same way as Example 1, except that the conditions were changed as described in Table 1. In Example 11, similarly to Example 1, the crystal sample 1 was fixed to the pedestal 2, the crystal cutting wire W and the crystal sample 1 were arranged so that the angle α' formed by the extending direction of the wire and the crystal was equal to 75.1°, and then the cutting was performed, as shown in FIGS. 5A and 5B. In Comparative Examples 1 to 4 and 11, the crystal sample 11 was fixed to the slope of the pedestal of which the slope angle δ was 28.1° and the linear cutting was tried, as shown in FIGS. 8A and 8B, but the crystal sample 11 was not cut linearly.

Similarly to Example 1, the results of measurement of waviness profiles of the plate crystals obtained after the cutting are shown in Table 1.

more efficiently provided than in the conventional method, the present invention has high industrial applicability.

The invention claimed is:

1. A method of manufacturing a hexagonal Group-III nitride semiconductor plate crystal by cutting a hexagonal Group-III nitride semiconductor crystal using a crystal cutting wire,
   wherein the hexagonal Group-III nitride semiconductor crystal has one principal face on one side and another principal face on an opposite side, and
   wherein the hexagonal Group-III nitride semiconductor crystal is cut by causing the crystal cutting wire to move so as to (i) divide the one principal face and the another principal face and (ii) satisfy conditions of Expressions (A) and (B):

$$25° < \alpha \leq 90°$$ Expression (A); and $$\beta = 90° \pm 5$$ Expression (B)

where α represents an angle formed by a c axis of the hexagonal Group-III nitride semiconductor crystal and a normal line of a crystal face cut out by the wire, and β represents an angle formed by a reference axis, which is obtained by forming a perpendicular projection from the crystal face cut out by the wire to the c axis of the hexagonal Group-III nitride semiconductor crystal, and a cutting direction.

2. The method according to claim 1, wherein a moving speed of the crystal cutting wire in the cutting direction is equal to or more than 1 mm/h.

3. The method according to claim 1, wherein the hexagonal Group-III nitride semiconductor plate crystal is cut by causing the crystal cutting wire to move so as to satisfy a condition of Expression (C):

TABLE 1

| | | Comparative Example 1 | Comparative Example 2 | Comparative Example 3 | Comparative Example 4 | Example 1 | Comparative Example 11 | Example 11 |
|---|---|---|---|---|---|---|---|---|
| Cut-out crystal face (principal face of plate crystal) | | | | (10-11) | | | (20-21) | |
| α (°) | | 61.9 | 61.9 | 61.9 | 61.9 | 61.9 | 75.1 | 75.1 |
| β (°) | | 0 | 0 | 0 | 0 | 90 | 0 | 90 |
| γ (°) | | 90 | 90 | 90 | 90 | 0 | 90 | 0 |
| Average particle size of abrasive grains (μm) | | 30-40 | 30-40 | 12-25 | 12-25 | 12-25 | 12-25 | 12-25 |
| Cutting speed (mm/h) | | 2.5 | 5 | 5 | 30 | 30 | 5 | 30 |
| Waviness profile WCM (μm) | : crystal 1 | 3.9 | 31.9 | 10.5 | 49.0 | 0.7 | 8.6 | 0.5 |
| | : crystal 2 | 9.5 | 25.3 | 9.9 | 38.5 | 0.5 | 9.6 | 0.7 |
| | : crystal 3 | 4.6 | 27.7 | 12.1 | 34.7 | 0.4 | 9.1 | 0.5 |
| | : average | 6.0 | 28.3 | 10.8 | 40.7 | 0.5 | 9.1 | 0.6 |

While the present invention is described in detail with reference to the specific embodiment, it will be apparent to those skilled in the art that the present invention can be modified or changed in various forms without departing from the concept and scope of the present invention.

Priority is claimed on Japanese Patent Application (Japanese Patent Application No. 2010-291559), filed on Dec. 28, 2010, the content of which is incorporated herein by reference.

INDUSTRIAL APPLICABILITY

By employing the manufacturing method according to the present invention, it is possible to obtain a hexagonal semiconductor plate crystal with small warpage even when a cutting operation is performed at a high speed. Since a high-quality hexagonal semiconductor plate crystal can be $$0° \leq \gamma < 75°$$ Expression (C)

where γ represents an angle formed by an extending direction of the crystal cutting wire and the reference axis.

4. The method according to claim 1, wherein a magnitude of warpage of the plate crystal is equal to or less than 1.0 μm/mm.

5. The method according to claim 1, wherein a maximum diameter of the plate crystal is equal to or more than 10 mm.

6. The method according to claim 1, wherein the plate crystal is manufactured by cutting two or more faces at a time using a plurality of crystal cutting wires installed in parallel with a gap therebetween.

7. The method according to claim 1, wherein a face formed by the cutting is ground after the cutting.

8. The method according to claim 1, wherein the hexagonal Group-III nitride semiconductor crystal is a gallium nitride crystal.

9. The method according to claim 1, wherein the hexagonal Group-III nitride semiconductor crystal has a disk shape or a semi-disk shape.

\* \* \* \* \*